United States Patent
Lopez et al.

(10) Patent No.: US 12,057,429 B1
(45) Date of Patent: Aug. 6, 2024

(54) TEMPORARY BONDING STRUCTURES FOR DIE-TO-DIE AND WAFER-TO-WAFER BONDING

(71) Applicant: HRL Laboratories, LLC, Malibu, CA (US)

(72) Inventors: Aurelio Lopez, Malibu, CA (US); Peter Brewer, Westlake Village, CA (US); Partia Naghibi Mahmoudabadi, Thousand Oaks, CA (US); Erik Daniel, Malibu, CA (US); Tahir Hussain, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 17/356,387

(22) Filed: Jun. 23, 2021

(51) Int. Cl.
*H01L 23/00* (2006.01)
(52) U.S. Cl.
CPC ............ *H01L 24/81* (2013.01); *H01L 24/13* (2013.01); *H01L 24/14* (2013.01); *H01L 24/16* (2013.01);
(Continued)
(58) Field of Classification Search
CPC .... H01L 2224/13013–81379; H01L 24/13–16
See application file for complete search history.

(56) References Cited

U.S. PATENT DOCUMENTS

| | | |
|---|---|---|
| 3,812,559 A | 5/1974 | Spindt |
| 4,912,844 A | 4/1990 | Parker |

(Continued)

FOREIGN PATENT DOCUMENTS

| | | |
|---|---|---|
| EP | 0 982 385 | 3/2000 |
| JP | 10-022338 | 1/1998 |

(Continued)

OTHER PUBLICATIONS

U.S. Appl. No. 17/356,386, Lopez, filed Jun. 23, 2021.

(Continued)

*Primary Examiner* — Hoa B Trinh
(74) *Attorney, Agent, or Firm* — Ladas & Parry, LLP

(57) ABSTRACT

A method for bonding two confronting electronic devices together wherein the two electronic devices are initially temporarily coupled together using a room temperature process with a plurality of knife-edge microstructures on at least a first one of the electronic devices engaging portions of the a second one of the electronic devices. The room temperature process involves applying a relatively low compressive force or pressure between the two electronic devices compared to the forces or pressures used in convention flip-chip bonding. The first one of the electronic devices and the second one of the electronic devices also have traditional contact pads that are spaced from each other by a standoff distance when the devices are initially coupled together using the room temperature process. This allows for inspection of the two electronic devices while they are initially temporarily coupled together. In need be, the two can be separated at this stage for re-work After passing inspection, a relatively higher compressive force or pressure is applied between the two electronic devices to cause the standoff distance to decrease to zero and for the contact pads confronting each other on the confronting two electronic devices to weld thereby permanently bonding the two electronic devices together.

11 Claims, 5 Drawing Sheets

(52) U.S. Cl.
CPC .............. *H01L 2224/13013* (2013.01); *H01L 2224/13016* (2013.01); *H01L 2224/13144* (2013.01); *H01L 2224/13466* (2013.01); *H01L 2224/14051* (2013.01); *H01L 2224/16057* (2013.01); *H01L 2224/80201* (2013.01); *H01L 2224/80986* (2013.01); *H01L 2224/81053* (2013.01); *H01L 2224/81193* (2013.01); *H01L 2224/81203* (2013.01); *H01L 2224/81379* (2013.01)

(56) References Cited

U.S. PATENT DOCUMENTS

| | | |
|---|---|---|
| 5,032,896 A | 7/1991 | Little |
| 5,161,093 A | 11/1992 | Gorczyca |
| 5,284,548 A | 2/1994 | Carey |
| 5,312,765 A | 5/1994 | Kanber |
| 5,324,687 A | 6/1994 | Wojnarowski |
| 5,353,498 A | 10/1994 | Fillion |
| 5,485,038 A | 1/1996 | Licari |
| 5,489,554 A | 2/1996 | Gates |
| 5,545,291 A | 8/1996 | Smith |
| 5,609,907 A | 3/1997 | Natan |
| 5,751,018 A | 5/1998 | Alivisatos |
| 5,772,905 A | 6/1998 | Chou |
| 5,783,856 A | 7/1998 | Smith |
| 5,800,650 A | 9/1998 | Anderson |
| 5,824,186 A | 10/1998 | Smith |
| 5,861,670 A | 1/1999 | Akasaki |
| 5,877,550 A | 3/1999 | Suzuki |
| 5,904,545 A | 5/1999 | Smith |
| 5,929,521 A * | 7/1999 | Wark .............. H01L 23/49811 257/E21.511 |
| 6,037,255 A | 3/2000 | Hussein |
| 6,096,386 A | 8/2000 | Biebuyck |
| 6,130,823 A | 10/2000 | Lauder |
| 6,165,911 A | 12/2000 | Calveley |
| 6,294,741 B1 | 9/2001 | Cole, Jr. |
| 6,296,171 B1 | 10/2001 | Hembree |
| 6,326,058 B1 | 12/2001 | Biebuyck |
| 6,417,025 B1 | 7/2002 | Gengel |
| 6,479,395 B1 | 11/2002 | Smith |
| 6,500,694 B1 | 12/2002 | Enquist |
| 6,507,989 B1 | 1/2003 | Bowden |
| 6,541,346 B2 | 4/2003 | Malik |
| 6,579,463 B1 | 6/2003 | Winningham |
| 6,586,338 B2 | 7/2003 | Smith |
| 6,611,237 B2 | 8/2003 | Smith |
| 6,652,808 B1 | 11/2003 | Heller et al. |
| 6,656,568 B1 | 12/2003 | Winningham |
| 6,657,289 B1 | 12/2003 | Craig |
| 6,727,579 B1 * | 4/2004 | Eldridge .................. H01L 24/72 257/E23.024 |
| 6,946,322 B2 | 9/2005 | Brewer |
| 7,105,376 B1 | 9/2006 | Brewer |
| 7,223,635 B1 | 5/2007 | Brewer |
| 7,622,813 B2 | 11/2009 | Brewer |
| 2002/0005294 A1 | 1/2002 | Mayer |
| 2002/0019068 A1 | 2/2002 | Ericson |
| 2002/0045030 A1 | 4/2002 | Ozin |
| 2003/0062123 A1 | 4/2003 | Hunter |
| 2003/0068519 A1 | 4/2003 | Brewer |
| 2003/0112576 A1 | 6/2003 | Brewer |
| 2003/0140317 A1 | 7/2003 | Brewer |
| 2004/0016998 A1 | 1/2004 | Fonstad |
| 2005/0012191 A1 | 1/2005 | Gilleo |
| 2007/0132097 A1 | 6/2007 | Wark |
| 2008/0185705 A1 | 8/2008 | Osborn |
| 2010/0032832 A1 | 2/2010 | Tomura |
| 2012/0279287 A1 | 11/2012 | Andry |
| 2013/0106453 A1 | 5/2013 | Ikegami |
| 2016/0084882 A1 | 3/2016 | Dang |
| 2016/0111387 A1 * | 4/2016 | Dang .................... H01L 22/20 257/737 |
| 2017/0010315 A1 | 1/2017 | Hironaka |
| 2017/0048976 A1 | 2/2017 | Prevatte |
| 2018/0096988 A1 | 4/2018 | Long |
| 2021/0063439 A1 * | 3/2021 | Daniel .............. G01R 1/06744 |
| 2021/0399184 A1 | 12/2021 | Motoyoshi |

FOREIGN PATENT DOCUMENTS

| | | | |
|---|---|---|---|
| WO | 01/33300 | 5/2001 | |
| WO | WO-2008151301 A1 * | 12/2008 | ............. H01L 24/05 |
| WO | 2010-141264 A1 | 12/2010 | |

OTHER PUBLICATIONS

U.S. Appl. No. 17/070,826, Brewer, filed Oct. 14, 2020.
PCT International Preliminary Report on Patentability (Chapter II) from PCT/US2020/048553 mailed on May 6, 2021.
PCT International Search Report and Written Opinion from PCT/US2020/048553 mailed on Dec. 4, 2020.
From U.S. Appl. No. 10/888,169 (now U.S. Pat. No. 7,223,635), Notice of Allowance mailed on Jan. 16, 2017.
From U.S. Appl. No. 10/888,169 (now U.S. Pat. No. 7,223,635), office action mailed on Sep. 18, 2006.
From U.S. Appl. No. 10/888,169 (now U.S. Pat. No. 7,223,635), office action mailed on Mar. 22, 2006.
From U.S. Appl. No. 10/888,169 (now U.S. Pat. No. 7,223,635), office action mailed on Jan. 12, 2006.
From U.S. Appl. No. 11/789,233 (now U.S. Pat. No. 7,622,813), Notice of Allowance mailed on Aug. 25, 2009.
From U.S. Appl. No. 11/789,233 (now U.S. Pat. No. 7,622,813), Notice of Allowance mailed on Jul. 17, 2009.
From U.S. Appl. No. 11/789,233 (now U.S. Pat. No. 7,622,813), office action mailed on Mar. 5, 2009.
Anderson, et al., "Technique for Connecting Electrical Leads to Semiconductors" Journal of Applied Physics 28, 923 (1957), pp. 923-924.
Bains, S., "Circuit Blocks Attached Via DNA," Electronic Engineering Times, pp. 39 and 44 (Mar. 9, 1998).
Bains, S., "Double Helix Doubles as Engineer," Science, vol. 279, pp. 2043-2044 (Mar. 27, 1998).
Bobbio, S.M., et al., "Integrated Force Arrays," IEEE Proceedings of the Workshop on Micro Electro Mechanical Systems (MEMS), Fort Lauderdale, pp. 149-154 (Feb. 7-10, 1993).
Bohringer, K.F., et al., "Modeling of Capillary Forces and Binding Sites For Fluidic Self-Assembly," MEMS: 2001: The 14th IEEE International Conference on Micro Electro Mechanical Systems, pp. 369-374 (2001).
Borzenko, T., et al., "Polymer Bonding Process for Nanolithography," Applied Physics Letters, vol. 79, No. 14, pp. 2246-2248 (Oct. 1, 2001).
Chou, S.Y., et al., "Imprint of Sub-25 nm Vias and Trenches in Polymers, " Appl. Phys. Lett., vol. 67, No. 21, pp. 3114-3116 (Nov. 20, 1995).
Chou, S.Y., et al., "Nanoimprint Lithography," J. Vac. Sci. Technol. B, vol. 14, No. 6, pp. 4129-4133 (Nov./Dec. 1996).
Cohn, M.B., et al., "Microassembly Tehnologies for MEMS," SPIE Micromachining and Microfabrication, Conference on Micromachining and Microfabrication Process Technology IV, Santa Clara, CA, 15 pages total (Sep. 21-22, 1998).
Coucoulas, et al., "Compliant Bonding—A New Technique for Joining Microelectronic Components", IEEE Transactions on Electron Devices, vol. 15, No. 9, Sep. 1968, pp. 664-674.
Gracias, D.H., "Forming Electrical Networks in Three Dimensions by Self-Assembly," Science, vol. 289, pp. 1170-1172 (Aug. 18, 2000).
Hadley, M.A., "Vertical-Cavity Surface-Emitting Laser Diodes: Design, Growth, Mode Control and Integration by Fluidic Self-Assembly," UMI Dissertation Services, Sections 5.4, 5.5, and 5.6, pp. 75-81 (1994).
Hao, E., et al., "Buildup of Polymer/Au Nanoparticle Multilayer Thin Films Based on Hydrogen Bonding," Chem. Mater., vol. 12, No. 11, pp. 3392-3396 (2000).

(56) References Cited

OTHER PUBLICATIONS

IBM Technical Disclosure Bulletin, "Method to Control the Geometry and Vertical Profile of Via Holes in Substrate Materials," vol. 35, No. 5, pp. 211-216 (Oct. 1992).
IBM Technical Disclosure Bulletin, "Use of High Precision Silicon Molds for Replicating Microelectronic Packaging Structures," vol. 30, No. 5, pp. 306-311 (Oct. 1987).
Kumar, A., et al., "Pattering Self-Assembled Monolayers: Applications in Materials Science," Langmuir, vol. 10, No. 5, pp. 1498-1511 (1994).
Saitou, K., et al., "Externally Resonated Linear Microvibromotor for Microassembly," Journal of Microelectromechanical Systems, vol. 9, No. 3, pp. 336-346 (Sep. 2000).
Srinivasan, U., et al., "Fluidic Self-Assembly of Micromirrors onto Surface Micromachined Actuators," IEEE, pp. 59-60, (2000).
Srinivasan, U., et al., "Microstructure to Substrate Self-Assembly Using Capillary Forces," Journal of Microelectromechanical Systems, vol. 10, No. 1, pp. 17-24 (Mar. 2001).
Terfort, A., et al., "Self-Assembly of an Operating Electrical Circuit Based on Shape Complementarity and The Hydrophobic Effect," Advanced Materials, vol. 10, No. 6, pp. 470-473, (1998).
Terfort, A., et al., "Three-dimensional Self-Assembly of Millimetre-Scale Components," Letters to Nature, vol. 386, pp. 162-164 (Mar. 13, 1997).
Tormen, M., et al., "Thermocurable Polymers as Resists for Imprint Lithography," Electronics Letters, vol. 36, No. 11, pp. 983-984 (May 25, 2000).
Zhang, W., et al., "Multilevel Nanoimprint Lithography with Submicron Alignment Over 4 in. Si Wafers," Applied Physics Letters, vol. 79, No. 6, pp. 845-847 (Aug. 6, 2001).
"Image Reversal Resists and their Processing" (available at https://www.microchemicals.com/technical_information/image_reversal_resists.pdf), viewed Nov. 9, 2020.
"Probe Card" by MJC Micronics Japan Co., Ltd. (available at www.mjc.co.jp/en/products/semiconductor/probe_card.html), printed Nov. 9, 2020.
"Pyramid Probe Cards" by Cascade Microtech (available at www.cascademicrotech.com/files/PYRPROBE_APP.PDF), 2004.
"TPEGTM MEMS T4—Power Your Device" by Technoprobe (available at www.technoprobe.com/soluzione/tpeg-mems-t4-power-your-device), viewed Nov. 9, 2020.
"Vx-MP" by FormFactor (available at www.formfactor.com/product/probe-cards/foundry-logic/vx-mp/), viewed Nov. 9, 2020.
T. Shimatsua and M. Uomoto "Atomic diffusion bonding of wafers with thin nanocrystalline metal films", J. Vac. Sci. Tech. B 28, 706 (2010).
Technique for Connecting Electrical Leads to Semiconductors, Journal of Applied Physics 28, 923 (1957).
Mechanical and Electrical Properties of Thermo-compression Bonds, Session 22.1, McKinnon, M.C., 1963.
Thermocompression Bonding of External Package Leads on Integrated Circuit Substrates; Session 12, Chairman Iwerson, J.E. (1967).
Coucoulas, A "Compliant Bonding—A New Technique for Joining Microelectronic Components" IEEE Trans. Electron Devices, vol. ED-13, No. 9, Sep. 1968.
C. Birleanu , M. Pustan, V. Merie, R. Müller, R. Voicu, A. Baracu, and S. Craciun, "Temperature effect on the mechanical properties of gold nano films with different thickness", IOP Conf. Series: Materials Science and Engineering 147 012021 (2016).
D. Temple, "Recent progress in field emitter array development for high performance applications", Materials Science and Engineering, R24 185-39 (1999).
From U.S. Appl. No. 17/356,386 (non-publication request filed), Office Action mailed on Jun. 6, 2023.
From U.S. Appl. No. 17/356,386 (non-publication request filed), Office Action mailed on Sep. 28, 2023.
From U.S. Appl. No. 17/356,386 (non-publication request filed), Office Action mailed on Jan. 31, 2024.

\* cited by examiner

TEMPORARY BONDING STRUCTURES FOR DIE-TO-DIE AND WAFER-TO-WAFER BONDING

STATEMENT REGARDING FEDERALLY SPONSORED RESEARCH OR DEVELOPMENT

This invention was made with Government support. The Government has certain rights in the invention.

CROSS REFERENCE TO RELATED APPLICATIONS

This application is related to the following US Patent Applications: (1) U.S. patent application Ser. No. 17/006,491 filed 28 Aug. 2020 with the title "Small Pitch Integrated Knife Edge Temporary Bonding Microstructures"; (2) patent application Ser. No. 17/070,826 filed 14 Oct. 2020 with the title "Integrated Mechanical Aids for High Accuracy Alignment" and (3) U.S. patent application Ser. No. 17/356,386 filed on the same date as this application with the title "Room Temperature Thermocompression Bonding using High Pressure Contacts", the disclosures of which are hereby incorporated herein by reference.

TECHNICAL FIELD

Temporary bonding structures for die-to-die and wafer-to-wafer bonding that may be used for low temperature bonding operations.

BACKGROUND

In current state-of-the-art microelectronic packaging and integration manufacturing, thermocompression bonding of microelectronic components requires high pressures (>30 MPa) and high temperatures (>200° C.) to join metal surfaces to achieve high yields between component fine-pitch bond pads (contact pads) as the metal surfaces are not atomically-flat, with varying degrees of surface roughness an asperities, and are exposed to photolithographic processes (photoresists, developers, organic solvents) resulting in contamination, and may have surface oxides due to extended air exposure. As such, high pressure is needed to overcome surface roughness and asperities to achieve intimate atomic-level surface contact over extended areas (i.e., wafer, tile, die) and to break oxide surface films, if present, and temperature is needed to soften the metal to reduce the required pressure to initiate atomic-level bonding.

The present invention overcomes this high temperature requirement and allows thermocompression bonding of microelectronic components to occur at much lower temperatures, such as room temperature (conventionally defined as about 20° C. (~68° F.)).

Thermocompression bonding is a type of solid-state welding that establishes atomic-level bonding between two metal surfaces through intimate contact under pressure without the formation of a liquid phase. At room temperature, enormous pressure is required to overcome surface asperities, and if oxides are present, to plastically deform the surface to break through hard oxide layers. Elevated temperatures are typically employed in the prior art to soften the metals thus offsetting the pressure also used for thermocompression bonding.

Thermocompression bonding is a standard process in the electronics industry for die-to-die, die-to-wafer, and wafer-to-wafer integration and packaging. Leading contact metals for thermocompression bonding include Au—Au, Al—Al, and Cu—Cu, with Au being the easiest to bond because of the lack of an oxide. For typical thermocompression bonding, flat (blunt), thin-film bond pads are employed and require high pressures (>3 MPa) and moderate temperatures to form reliable electrical contacts with high mechanical strength.

Ultra High Vacuum (UHV) deposited, pristine (contamination free), crystalline metal (Al, Au, Ag, Cu, Si, Co, Ni, Pt, Ti, Ru, Fe, Cr, Mo, and Ta) surfaces that are atomically flat thermocompression bond at room temperature with small applied pressures forming metallurgical interfaces are known (see T. Shimatsua and M. Uomoto, "Atomic diffusion bonding of wafers with thin nanocrystalline metal films", J. Vac. Sci. Tech. B 28, 706 (2010)). However, to achieve atomic level (metallurgical) bonding over extended areas (wafer, tiles, and die) requires strong pressures even with atomically flat surfaces. Atomic-level bonding occurs because most metals (Al, Au, Cu, Ni, Pt, Ti, Cr, Ta, Mo) used in integrated circuit integration exhibit high atomic diffusion rates (i.e., bulk, grain boundary, and surface diffusion processes) that allow atoms to move rapidly within and between surfaces. These rates are exponentially temperature dependent that improve the kinetics of the process at higher temperatures. The Young's modulus and hardness of thin metal films are also temperature dependent and strongly decrease with increasing temperature (see C. Birleanu, M. Pustan, V. Merie, R. Müller, R. Voicu, A. Baracu, and S. Craciun, "Temperature effect on the mechanical properties of gold nano films with different thickness", *IOP Conf. Series: Materials Science and Engineering* 147 012021 (2016)) providing a further mechanism for establishing atomic-level contact for flat metal surfaces. For example, the Young's modulus of thin Au films (30-50 nm) decreases by ~30% and the hardness decreases by 2× from room temperature to 100° C.

Also see D. Temple, "Recent progress in field emitter array development for high performance applications", *Materials Science and Engineering*, R24 185-39 (1999).

While low temperature (friction bonding, seizing) solid-state bonding of metal surfaces has been reported in the literature for over 50 years, even at low temperatures, these techniques require high pressures to result in a permanent bond between dies or wafers. See, for example, Technique for Connecting Electrical Leads to Semiconductors, *Journal of Applied Physics* 28, 923 (1957); Mechanical and Electrical Properties of Thermo-compression Bonds, Session 22.1, Mckinnon, M. C., 1963; Thermocompression Bonding of External Package Leads on Integrated Circuit Substrates; Session 12, Chairman Iwerson, J. E. (1967); and Compliant Bonding-A New Technique for Joining Microelectronic Components; Coucoulas, A., *IEEE Trans. Electron Devices*, Vol. ED-13, No. 9, September 1968.

However, temporary aligned "tack" bonding of microelectronic parts (ICs, dies or wafer) is not believed to be known in the art. A microfabrication process with fine-alignment capability at room temperature that allows inspection and rework, if needed, would be a desirable technology. In this invention novel knife-edge microstructure contacts are disclosed that enable high local pressures to be applied and form weak temporary bonds, to be established at room temperature, or stronger bonds if higher pressures and temperatures are used, to be realized. These microstructures, shown in FIG. 1a, for example, can be fabricated using standard microfabrication processes and are easily integrated into CMOS or other device technology layout formats. When a knife-edge microstructure on one chip, die or wafer are mated to a knife-edge microstructure on another chip, die or wafer, the area of contact between the two opposing knife-edge microstructures is very small, so that the pressure (per unit area) occurring between them is very high. The damage done to the knife-edge microstructures, should the two opposing chips, dies and/or wafers be separated (for example, after failing some inspection) is minor (see FIG. 1b), allowing the two chips, dies and/or wafers to be again tack bonded together reusing the knife-edge microstructures.

An object of this invention is to form temporary (such as "tack") bonds or connections between stacked component pairs including die-to-die, die-to-wafer, and wafer-to-wafer configurations to allow alignment and/or quality inspection and/or component testing prior to permanent flip-chip bonding. This invention finds use in electronic packaging and integration applications that currently lack a temporary bonding technology to allow alignment and/or tilt inspection, and if necessary repair or adjustment, before final attachment, such as: 3D and 2.5D integration, heterogeneous integration of diverse semiconductors, optical alignment of optical devices, and/or hybridization processes. The advantages of temporary room temperature tack bonding include the following:

Allows temporary aligned attachment of electrical components (die, tiles, wafers), Provides weak bonds that can be separated and re-used, many times if need be since the weak bonds cause little damage to at the bond interfaces and that enables multiple bond/debond cycles, if needed, Accommodates surface topography by plastic deformation and wide process variation (large z-axis variation tolerant)

High yield process

Small footprint allows easy adoption and addition to existing layouts and provides a standoff distance between temporarily bonded chips, dies or wafers.

The present invention provides a novel device structure and process that enables temporary thermocompression bonding of microelectronic components (die-to-die, die-to-wafer, and wafer-to-wafer) to be performed at room temperature before final bonding. The method relies on knife-edge shaped device microstructures, one embodiment of which is coined "hashtags" because of their "#" like shape, that plastically deform under pressure at room temperature (or lower temperatures than generally used for thermocompression bonding) and form temporary attachment between components that can be separated or fully bonded using themselves or other bond pad structures in a subsequent step. The embodiment of knife-edge shaped device microstructures which can take on a "hashtag" configuration are the subject of U.S. patent application Ser. No. 17/356,386 filed 23 Jun. 2021 and entitled "Room Temperature Thermocompression Bonding using High Pressure Contacts", the disclosure of which is hereby incorporated herein by reference.

The hashtag embodiment of the microstructures consists of arrays of rows of tapered metal microstructures that are preferably oriented perpendicularly during tack bonding to minimize the force needed to temporarily join the components. In current, prior art flip-chip bonding applications, thermocompression bonding of microelectronic components is a permanent process (all or nothing) and misaligned parts are not repairable. The hashtag bonding method does not require high pressures and high temperatures (>200° C.) to join metal surfaces, but rather uses low forces and room temperature condition, allowing inspection and handling to be performed before the permanent bonds are engaged by applying higher pressures and temperatures. Since the electrical contact pads are not necessarily engaged, repair of the temporarily tacked components can be separated without damage to the functional parts of the device.

Use of the hashtag embodiment of the knife-edge shaped microstructures in the present invention is preferred, but the present invention may use of embodiments of knife-edge shaped device microstructures in addition to the hashtag embodiment or in lieu of the hashtag embodiment.

BRIEF DESCRIPTION OF THE INVENTION

Disclosed is a method for bonding two confronting electronic devices together wherein the two electronic devices are initially temporarily coupled together using a room temperature process with a plurality of knife-edge microstructures on at least a first one of the electronic devices engaging portions of the a second one of the electronic devices. The room temperature process involves applying a relatively low compressive force or pressure between the two electronic devices compared to the forces or pressures used in conventional flip-chip bonding. The first one of the electronic devices and the second one of the electronic devices also have traditional contact pads that are spaced from each other by a standoff distance when the devices are initially coupled together using the room temperature process. This allows for inspection of the two electronic devices while they are initially temporarily coupled together. If need be, the two can be separated at this stage for re-work After passing inspection, a relatively higher compressive force or pressure is applied between the two electronic devices to cause the standoff distance to decrease to zero and for the contact pads confronting each other on the confronting two electronic devices to weld thereby permanently bonding the two electronic devices together.

In one aspect the present invention provides a method for bonding two electronic devices together wherein the two electronic devices, dies or wafers are initially temporarily coupled together using a room temperature process with a plurality of knife-edge microstructures on at least a first one of the electronic devices, dies or wafers engaging portions of the a second one of the electronic devices by applying a relatively lower compressive force or pressure between the two electronic devices, dies or wafers, the first one of the electronic devices, dies or wafers and the second one of the electronic devices, dies or wafers also having contact pads that are spaced from each other by a standoff distance when the devices are initially coupled together using said room temperature process, thereby allowing for inspection of the two electronic devices, dies or wafers while they are initially temporarily coupled together but spaced apart by at least said standoff distance and thereafter applying a relatively higher compressive force or pressure between the two electronic devices, dies or wafers to cause the standoff distance to decrease to zero and for the contact pads confronting each other on the two electronic devices, dies or wafers to weld.

In another aspect the present invention provides a method of bonding two electronic devices together wherein the two electronic devices, dies or wafers are initially temporarily coupled together using a room temperature process with a plurality of knife-edge microstructures on each of the first one and the second one of the electronic devices, dies or wafers, the plurality of knife-edge microstructures on each of the first one and the second one of the electronic devices, dies or wafers engaging each other by applying a relatively lower compressive force or pressure between the two electronic devices, dies or wafers, the first one of the electronic devices, dies or wafers and the second one of the electronic devices, dies or wafers also having contact pads that are spaced from each other by a standoff distance when the devices are initially coupled together using said room temperature process, thereby allowing for inspection of the two electronic devices, dies or wafers while they are initially temporarily coupled together but spaced apart by at least said standoff distance and thereafter applying a relatively higher compressive force or pressure between the two electronic devices, dies or wafers to cause the standoff distance to decrease to zero and for the contact pads confronting each other on the two electronic devices, dies or wafers to weld.

In yet another aspect the present invention provides a method of making a thermo-compression bond between mating structures on first and second electronic components, dies or wafers, the method comprising: forming initial mating structures on the first electronic component, die or wafer as an array of microstructures that project in a direction essentially normal to a major surface of the first electronic component, die and/or wafer, the microstructures each terminating at an elongate edge or surface distal from the major surface of the first electronic component, die or wafer; forming additional mating structures on the first electronic component, die or wafer as an array of planar pads having a height extending way from said major surface of the first electronic component, die or wafer which is less than a height the array of microstructures projecting in said direction essentially normal to the major surface of the first electronic component, die or wafer of the above a major surface of the first electronic component, die or wafer; forming initial mating structures on the second electronic component, die or wafer as an array of structures arranged to mate with the array of microstructures that project in a direction essentially normal to the major surface of the first electronic component, die or wafer; forming additional mating structures on the second electronic component, die or wafer as an array of structures arranged to mate with additional mating structures on the first electronic component, die or wafer; applying an initial compressive pressure between the first and second electronic components, dies or wafers to cause the initial mating structures on the first and second electronic components, dies or wafers to weld temporarily; inspecting the first and second electronic components, dies or wafers whose initial mating structures are temporarily welded together; and applying a subsequent compressive pressure between the first and second electronic components, dies or wafers to cause the additional mating structures on the first and second electronic components, dies or wafers to weld.

In still yet another aspect the present invention provides an electronic component, die or wafer having a first array of structures that project in a direction essentially normal to a major surface of the electronic component, die or wafer, the microstructures each terminating at an elongate edge or surface distal from the major surface of the first electronic component, die or wafer spaced at a height h from said major surface and a second array of structures having flat, planar surfaces spaced at a height h' from said major surface, the height h' being no more than one half the height h.

BRIEF DESCRIPTION OF THE DRAWINGS

FIG. 1d depicts a "hashtag" embodiment of the knife-edge shaped microstructures.

DETAILED DESCRIPTION

Figure 1B:
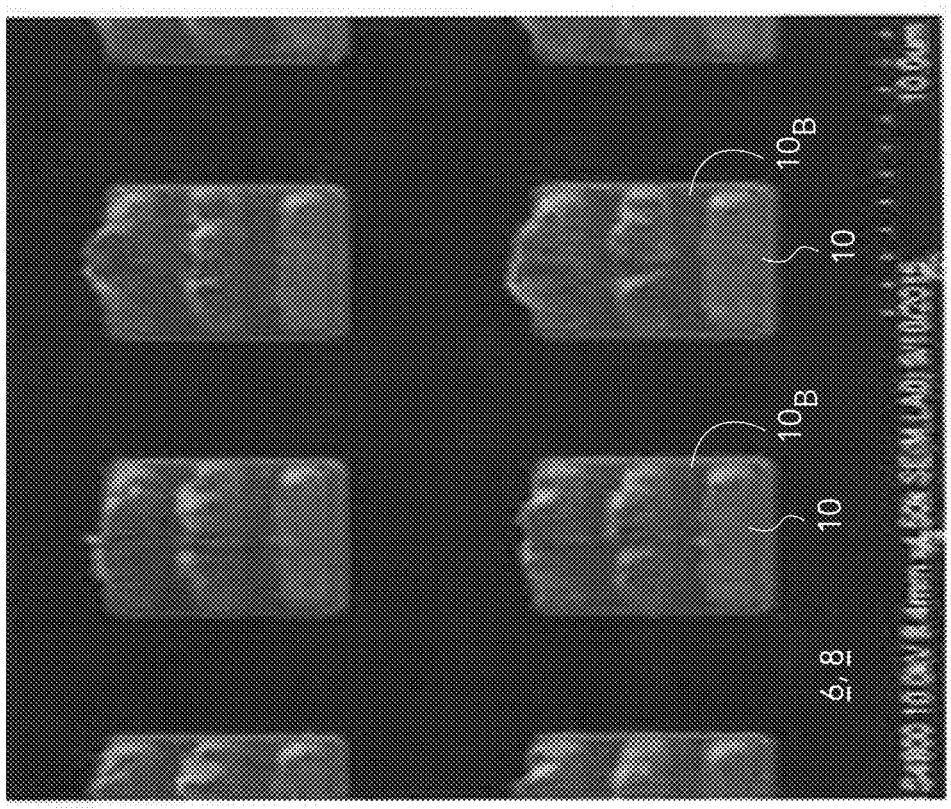
FIGS. 1a and 1b are Scanning Electron Microscope (SEM) micrographs of microstructures consisting of arrays of knife-edge microstructures (see, FIG. 1a, the microstructures shown on a semiconductor die or wafer, as fabricated) that plastically deform (see FIG. 1b showing the results of two dies or wafer being mated using the microstructures and thereafter being separated) having formed localized thermo-compression bonds at the intersecting tips or knife-edges of the mating microstructures. These figures demonstrate micro structures can be repeatedly bonded and debonded as the microstructures do not end up being undue damaged by bonding and debonding.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Temporary aligned "tack" bonding of microelectronic parts is not believed to be known in the prior art. While low temperature (friction bonding, seizing) solid-state bonding of metal surfaces has been well established and has been reported in the literature for over 50 years (even at low temperatures), a microfabrication process, with fine-pitch and fine-alignment capability, at room temperature, that allows for inspection and rework, if needed, is lacking. In this invention one embodiment of novel knife-edge microstructure contacts is disclosed that enables high local pressures to be applied and form weak temporary bond to be established at room temperature or stronger bonds (if higher pressures and temperatures are used). An embodiment of these microstructures, shown in FIGS. 1a and 1b, are fabricated, preferably using standard microfabrication processes, and are easily integrated into CMOS or other device technology layout formats.

Thermocompression bonding is a type of solid state welding that establishes atomic-level bonding between two metal surfaces through intimate contact under pressure without the formation of a liquid phase. At room temperature for flat mating surfaces, large pressures are required to overcome surface asperities, and if oxides are present, to plastically deform the surface to break through hard oxide layers. Elevated temperatures are typically employed to soften the metals and offset the required pressure requirements for thermocompression bonding. The bonding structures disclosed herein utilize tapered microstructures 10, with sharp edges, disposed on chips, chiplets, dies or wafers 6, 8 (simply called dies or wafers herein) that localize the initial contact between the microstructures at the sharp pointed end areas (sub-$\mu m^2$ in area) to induce large pressures at relatively low applied forces between the opposing dies or wafers 6, 8. This allows room temperature thermocompression bonding using common microelectronic contact metals such gold, copper, aluminum or other materials. The small contact areas of the preferably orthogonally oriented microstructures 10 enable enormous pressures to be established between the mating metal tip's surfaces $10_{KE}$ during bonding of the microstructures 10 on opposing die or wafers 6, 8. At these pressures, significant plastic deformation of the microstructure occurs and allows local intimate atomic-level contact across their contacting interface. Because the knife-edge structures 10 are preferably sharp-edged and largely asperity free, no compression force of particular significance is required to overcome these types of barriers and elevated temperatures are not needed to soften the metal as the tips of the structures easily plastically deform when they contact one another.

One embodiment of the presently disclosed technology involves a structure that enables thermocompression bonding (die-to-die, die-to-wafer, and wafer-to-wafer, etc.) of microelectronic components (dies, wafers, integrated chips, etc.) and a related method using common interconnect metals (such as Au, Cu, Al, W and many other interconnection materials are also possible, including Pt, Pd, Ni, Co, Nb, Ti, TaN, and Ag, for example) to be performed at room temperature. The method relies on knife-edge shaped microstructures 10 that preferably plastically deform under pressure at room temperature and thereby form robust electrical contacts (as evidenced by high yielding daisy chain test circuits and robustness to temperature-cycling, see U.S. patent application Ser. No. 17/356,386 filed 23 Jun. 2021 with the title "Room Temperature Thermocompression Bonding using High Pressure Contacts").

Figure 1A:
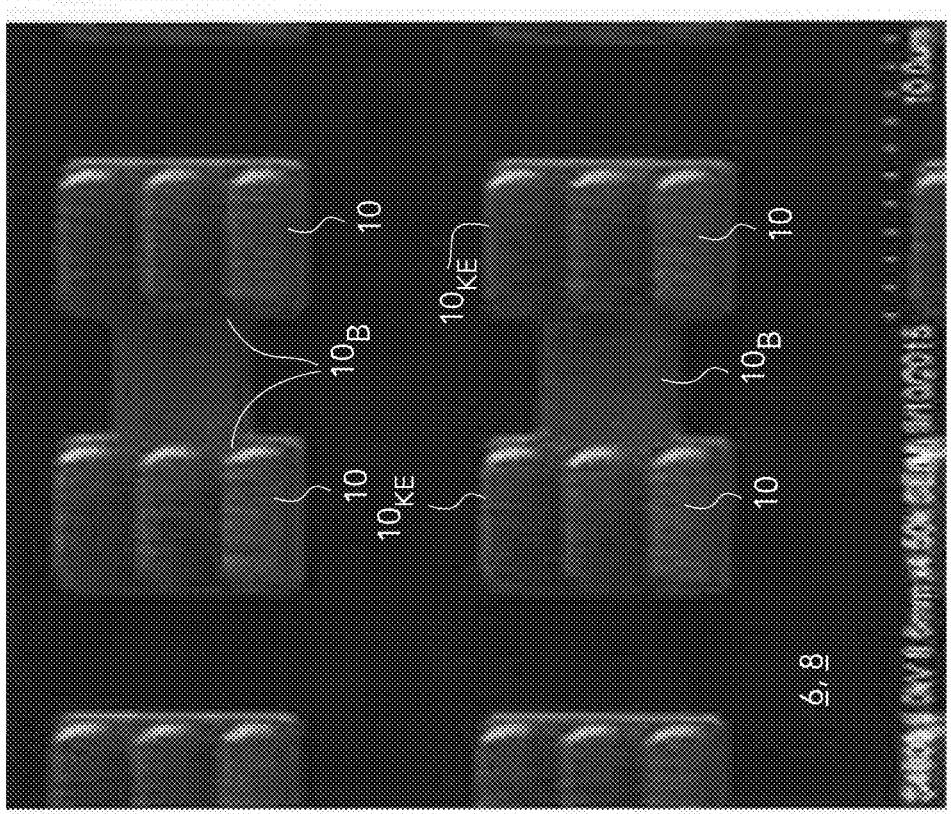

FIGS. 1a and 1b are SEM micrographs of knife-edge shaped microstructures 10 used to form Au—Au thermocompression bonds at room temperature. Each microstructure 10 has a distal edge (called a 'knife edge' herein) $10_{KE}$ which projects away from a contact pad 108. The contact pad 10; preferably supports a plurality of knife-edge shaped microstructures 10, but may be omitted in some embodiments. In FIGS. 1a and 1b, the contact pads 10g each support three or more knife-edge shaped microstructures 10, but the number of supported knife-edge shaped microstructures 10 on a pad or base 108 may be more than or fewer than three (and a contact pad $10_B$ may support only a single knife-edge shaped microstructure 10 if desired). The height h (for example, see FIG. 1f) of the knife-edge shaped microstructures 10 is preferably about 1 μm and height h may be desirously in the range of 0.1 to 10 μm). The lateral length of the knife-edge in this embodiment will depend on the number of knife-edges from other knife-edge shaped microstructures 10 that will engage with it when compression bonding occurs (see, for example, FIG. 1d). The length of a line (or surface) defined by the knife-edges of the knife-edge shaped microstructures 10 is preferably disposed parallel or essentially parallel to a major surface of the dies, wafer of integrated circuit 6, 8 from which the microstructures 10 project.

Figure 1C:
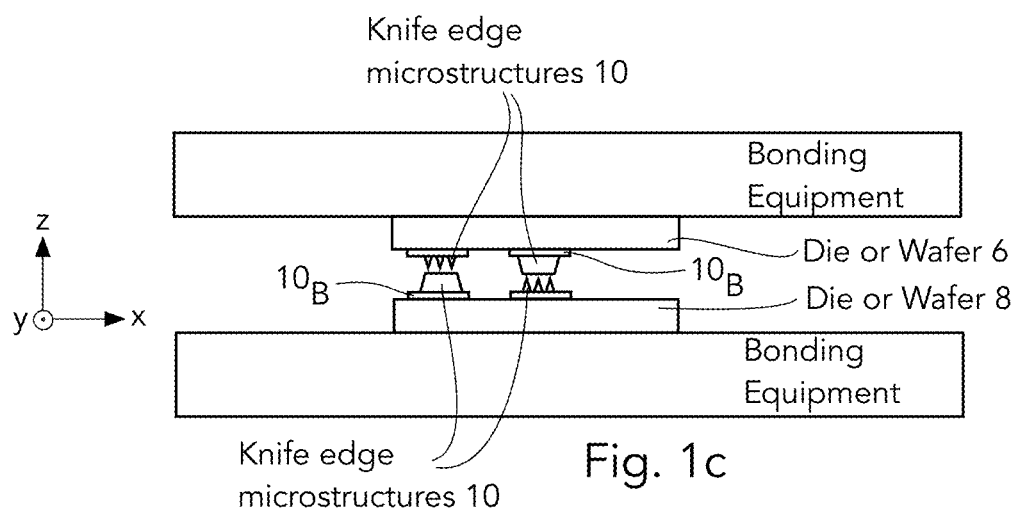
FIG. 1c depicts two dies or wafers bearing knife-edge shaped microstructures that are brought into contact to mate with each other, preferably using bonding equipment.

When compression bonding occurs, one die or wafer 6 (preferably bearing a plurality of knife-edge shaped microstructures 10) is brought into contact with an opposite die or wafer 8 (also preferably bearing a plurality of knife-edge shaped microstructures 10) preferably using, for example, a precision bonding machine, as is shown in FIG. 1c. A precision bonding machines of current technology can accurately align structures to 0.5 μm while more conventional bonding machines accurately align structures to about 2-3 μm. A more accurate, precision bonding machine is preferred at this stage. The knife edges $10_{KE}$ of the microstructures 10 on the two dies or wafers 6, 8 are disposed at an angle relative to each other, which angle preferably is a right angle (90°), but other angles may be used if desired.

Figure 1D:
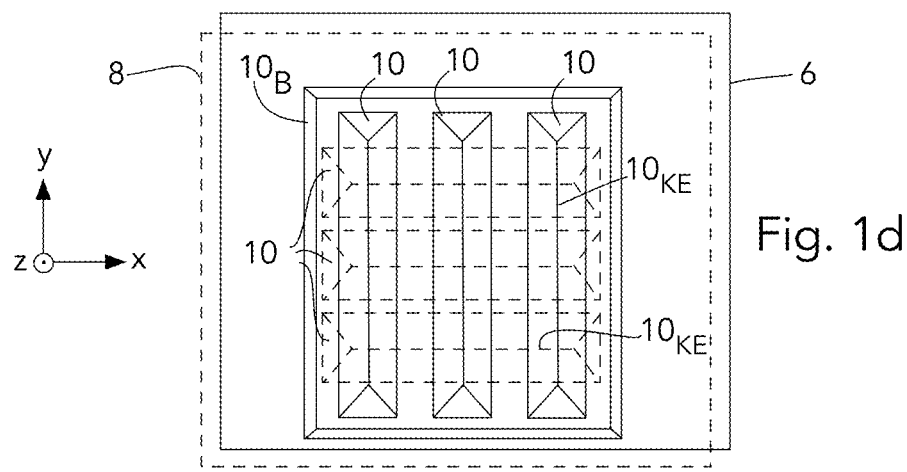
FIG. 1d is an enlarged plan view showing the knife-edge shaped microstructures (shown in solid lines) on a contact pad (also shown in solid lines) disposed on one die or wafer (also shown in solid lines) engaging knife-edge shaped microstructures (shown in dashed lines) on an opposite die or wafer (also shown in dashed lines).

FIG. 1d is an enlarged plan view showing the knife-edge shaped microstructures 10 (shown in solid lines) on a contact pad $10_B$ (also shown in solid lines) disposed on one die or wafer 6 (also shown in solid lines) engaging knife-edge shaped microstructures 10 (shown in dashed lines) on an opposing die or wafer 8 (also shown in dashed lines). In order to simplify FIG. 1d, the depiction of a contact pad 10; for the knife-edge shaped microstructures 10 of die or wafer 8 shown in dashed lines is omitted for ease of illustration.

Each contact pad $10_B$ (assuming both were depicted by FIG. 1d as they are depicted by FIG. 1c), has three knife-edge shaped microstructures 10 mounted thereon (and in ohmic conductivity therewith) as is also the case in FIG. 1c, it being understood that the number of knife-edge shaped microstructures 10 coupled with a single contact pad or base $10_B$ is a matter of design choice as is whether or not a contact pad or base 10; is utilized to support the knife-edge shaped microstructures 10.

The knife edges $10_{KE}$ of the three microstructures 10 coupled with die or wafer 6 shown in solid lines, are depicted as engaging the knife edges $10_{KE}$ of the three microstructures 10 coupled with die or wafer 8 shown in dashed lines, at a right angle (or 90°). A right angle of engagement is desirable, but the knife edges $10_{KE}$ of the microstructures 10 on one die or wafer may engage the knife edges $10_{KE}$ of the microstructures 10 on an opposing die or wafer at some other angle than 90° should that be desirable. But the knife edges $10_{KE}$ on one die or wafer 6 are preferably oriented perpendicularly to the knife edges $10_{KE}$ on the mating die or wafer 8 to maximize the pressure applied at their knife edges $10_{KE}$. However, as mentioned, other orientation angles are possible with a range >0° to 90°. This more or less right-angle orientation of the knife edges $10_{KE}$ of the three microstructures 10 shown in solid with respect to the knife edges $10_{KE}$ of the three microstructures 10 shown in dashed lines may be referred to as a "hashtag" or "#" configuration or arrangement.

The number of contact pads $10_B$ (with associated microstructures 10) utilized per die or wafer 6, 8 is also a matter of design choice. Some of the contact pads 10; (with associated microstructures 10) may be utilized for effecting electrical connections between the dies and wafers 6, 8 while others may be utilized simply for mechanical reasons of bonding the dies and wafers 6, 8 together. Typically, a die or wafer 6, 8 may have many contact pads 10; disposed thereon and each of the many contact pad $10_B$ has at least one, but preferably two or more, microstructures 10 each of which has a knife edge $10_{KE}$ disposed preferably parallel to each other on a given contact pads $10_B$. Each microstructure 10 has a major axis preferably disposed perpendicular (i) to a major surface of the contact pad 10; on which it is disposed and also (ii) to a major surface of the die or wafer 6, 8 on which its contact pad 10; is disposed.

The microstructures 10 may be formed of a metal selected from the group consisting of Au, Cu, Al, and W or alloys thereof or any of the other materials mentioned above. Moreover, combinations of relatively hard and relative soft metals may be utilized together in forming the microstructures 10 as shown, for example in FIGS. 1g and 1h.

The knife-edge microstructures 10 on a die or wafer may be thermocompression bonded to knife-edge microstructures 10 on an opposite die or wafer by applying a compressive force or pressure in the z direction of FIG. 1c. Bonding will occur at room temperatures, although the temperatures may be elevated if desired. The compressive force or pressure may be applied using commercial grade bonding equipment and preferably commercial grade bonding equipment capable of precision bonding.

A method for making the hashtag embodiment of the knife-edge microstructures 10 of FIGS. 1c and 1d using room temperature processing techniques is taught by U.S. patent application Ser. No. 17/356,386 filed 23 Jun. 2021 and entitled "Room Temperature Thermocompression Bonding using High Pressure Contacts" noted above.

Figure 1E:
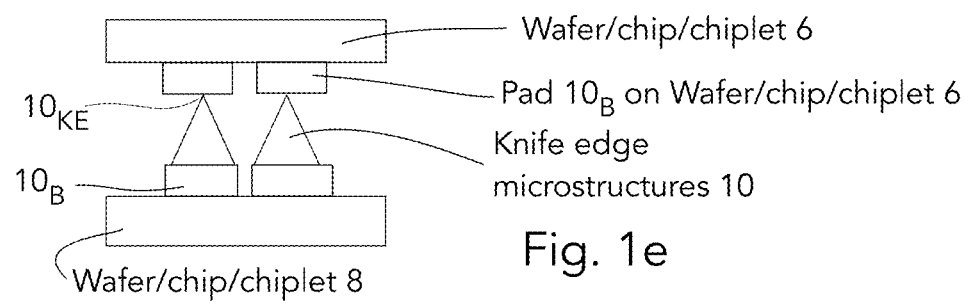
FIG. 1e depicts another embodiment of knife-edge shaped microstructures coupled via a pad on one wafer or chip, the knife-edge shaped microstructures thereof being juxtaposed against and contacting (at their knife-edges) a pad on another wafer or chip to thereby make electrical contact (connections) between circuits of the two juxtaposed wafers or chips.

FIG. 1e depicts another embodiment of knife-edge microstructures 10 which may be used in the presently disclosed method. The knife-edge microstructures 10 of FIG. 1e correspond to the probes taught by US Patent Applications: (1) U.S. patent application Ser. No. 17/006,491 filed 28 Aug. 2020 with the title "Small Pitch Integrated Knife Edge Temporary Bonding Microstructures". The knife-edge microstructures (which may be called probes in some embodiments) 10 of die or wafer 8 depicted by FIG. 1e are brought into contact with an associated pad 10 on die or wafer 6. The knife-edge microstructures 10 may plastically deform by this contact and preferably form a solid-state bond with the contacts pads pad 10; on opposing die or wafer 6. The weld using the knife-edge microstructures 10 in embodiment of FIG. 1e is likely less secure than the weld using the knife-edge microstructures 10 in embodiment of FIGS. 1a-1d, but this serves to demonstrate that the method disclosed herein may be used with a number of different configurations of knife-edge microstructures 10, including embodiments where the knife-edge microstructures 10 are used to probe (test) opposing dies of wafers 6, 8 before permanently bonding them together.

Figure 1F:
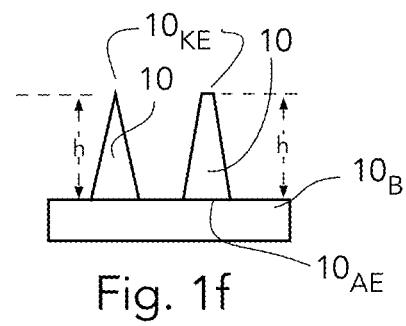
FIG. 1f shows both a sharp knife-edge embodiment and a blunt knife-edge embodiment of knife-edge shaped microstructures.

A sharp knife-edge microstructure $10_{KE}$ (as shown in FIGS. 1a-1e, for example) is preferred since that reduces the amount of force or pressure applied to dies or wafers 6, 8, that is needed to effect thermocompression bonding between two mating knife-edge microstructures 10. But a somewhat blunter knife-edge $10_{KE}$ may be acceptable in some embodiments since that may well require less processing to form sharp knife-edges $10_{KE}$. FIG. 1f depicts two knife-edge microstructures 10. The knife-edge microstructure 10 on the left hand side of FIG. 1f ends in a sharp knife-edge and when viewed in a plan view such as FIG. 1d, that knife-edge would define a line disposed essentially parallel to a major surface of die or wafer 6, 8. The knife-edge microstructure 10 on the right hand side of FIG. 1f ends in a blunt knife-edge $10_{KE}$ and when viewed in a plan view such as FIG. 1d, that blunt knife-edge would more or less define a plane disposed essentially parallel to a major surface of die or wafer 6, 8. The surface area of mating between mating knife-edge microstructures 10 for the hashtag embodiment is greater for the blunt knife-edges $10_{KE}$ than it is for the sharp knife-edges $10_{KE}$, but far less than for conventional flat pad bonding schemes since the ratio of the surface area of contact between mating knife-edge microstructures 10 should be at least 1:100 compared to the surface area (at reference $10_{AE}$) where the knife-edge microstructure 10 contacts pad $10_B$. Using the blunt knife-edge $10_{KE}$ embodiment (see the right-hand side of FIG. 1f) has a possible advantage of requiring less processing time to form the blunt knife-edge embodiment compared to forming the sharp knife-edge embodiment, but the disadvantage of needing more compressive pressure between opposing dies or wafers 6, 8 to effect tack bonding.

The blunt knife-edge $10_{KE}$ embodiment (see the right-hand side of FIG. 1f) may also be used with the embodiment of FIG. 1e, if desired.

Figure 1G:
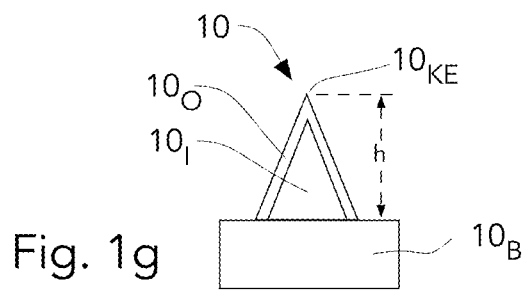
FIGS. 1g and 1h each depict, in cross-sectional views, a single knife-edge shaped microstructure having a relatively softer inner core with a relatively harder outer surface (see FIG. 1g) or a single knife-edge shaped microstructure having alternating layers of relatively softer and relatively harder materials (see FIG. 1h).

FIG. 1g depicts, in a cross-sectional view, a single knife-edge microstructure 10 having a relatively softer inner core $10_I$ (made of Au or Al, for example) and relatively harder outer surface $10_O$ (made of Ti or W, for example). These materials may be reversed with the inner core $10_I$ made of a relatively harder material and having outer surface $10_O$ made of a relatively softer material.

Figure 1H:
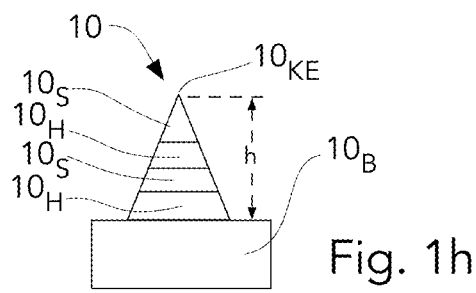

Alternatively, knife-edge microstructure 10 may be formed of a stack of layers (see, for example, the embodiment of FIG. 1h of a relatively harder material $10_H$, for example, alternating with layers of a relatively softer material $10_S$. So the stack embodiment of knife-edge microstructure 10 may comprise layers of different materials, such as Ti/Au/Ti/Au. Furthermore, the stack embodiment of FIG. 1g may be utilized as inner core $10_I$ of knife-edge microstructure 10 as depicted by FIG. 1g in which case the stack of materials of FIG. 1h is covered with an outer surface $10_O$ as is the case with the embodiment of FIG. 1g. The outer surface $10_O$ may similarly be defined as a stack of materials similar to that shown in FIG. 1h). As such, there are many ways in which a number of different materials having differing hardnesses (moduli of elasticity), for example, can give rise to a knife-edge microstructure 10 having a desired modulus of elasticity. The modulus of elasticity governs the contact properties of the knife-edge microstructure 10. Typically, it is the metal contact pad 10 of the die or wafer 6 that determines what material is desirously used for the knife-edge microstructure 10. Moreover, one would typically desire a sufficiently hard knife-edge microstructure 10 so that it plastically deforms the contact pad $10_B$ somewhat when the embodiment of FIG. 1e is utilized. We found that layered metal structures (see FIG. 1h) with alternating hard metals $10_H$ and soft metals $10_S$ so that the tip or pointed end $10_{KE}$ of a knife-edge microstructure 10, formed of Ti or Ni for example, would initially indent the contact pad $10_B$ of the die or wafer 6 and then the softer body portions $10_S$, formed of Al or Au, for example, of knife-edge microstructure 10 would spread out when the compressive force is applied by the die bonding equipment. The multilayer spike of FIG. 1h may also help in controlling the offset as softer top sections of the knife-edge microstructure 10 more easily deform than the harder lower layers. One embodiment thereof would be a softer top portion $10_S$ of Au on top of a harder bottom portion $10_B$ of Ti on the bottom of the knife-edge microstructure 10.

Figure 2A:
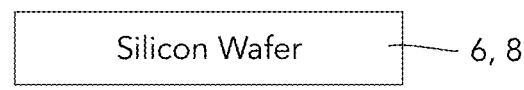
FIGS. 2a-2e depict an embodiment of a process flow for an initial temporary attachment process followed by a permanent bonding between two chips, chiplets and/or wafers.
Figure 2B:
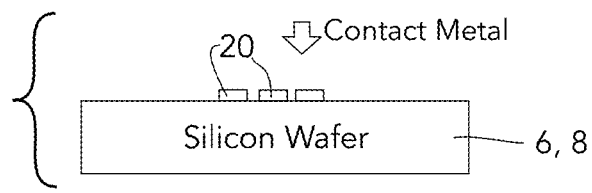
Figure 2C:
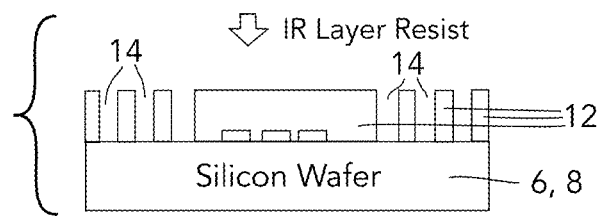
Figure 2D:
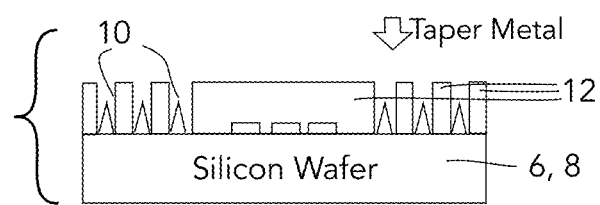
Figure 2E:
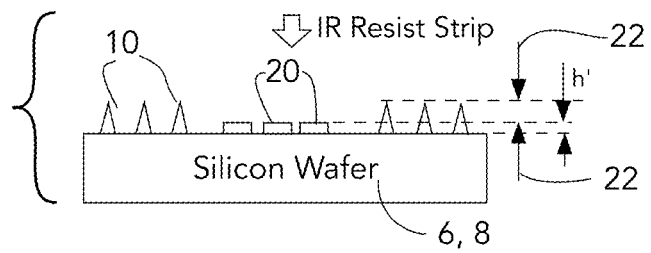

The height h of the knife-edge microstructures 10 can be designed over a wide range (<0.1 μm-10 μm, for example) depending on the linewidth opening G size in the resist 14 that also defines the width of the base of the knife-edge microstructures 10 (compare FIGS. 2d and 2e and also see FIG. 2e-1 of U.S. patent application Ser. No. 17/356,386 filed 23 Jun. 2021 with the title "Room Temperature Thermocompression Bonding using High Pressure Contacts". As just noted, the knife-edge microstructures 10 can be made blunter and less knife-edge-like by reducing the amount of metal deposited during their formation.

U.S. patent application Ser. No. 17/356,386 filed 23 Jun. 2021 with the title "Room Temperature Thermocompression Bonding using High Pressure Contacts" teaches the bonding of knife-edge microstructures 10 at room temperature. The term "room temperature" is meant to refer to the fact that no external additional heat is required for thermo-compression bonding to occur and colloquially to that range of air temperatures that most people prefer for indoor settings, which feel comfortable when wearing typical indoor clothing. So "room temperature" for the purpose of this disclosure is intended to refer to temperatures typically in the range of 20-22° C. (68-72° F.). It should be noted that while the present invention works well in the "room temperature" range of 20-22° C. (68-72° F.) it is also useful outside that range, so it should be understood that the present invention may be used in a wider range of temperatures, such as between 0° C. and 100° C. (32° F. to 212° F.), it being understood that (i) at temperatures below room temperature the force required to effect bonding between knife-edge microstructures 10 will be higher than that needed at room temperature and correspondingly (ii) at temperatures above room temperature the force required to effect bonding between knife-edge microstructures 10 will be lower than the needed at room temperature.

As an example of the utility of these knife-edge microstructures 10 for electronic integration and packaging applications, contacts using knife-edge microstructures 10 were created and patterned into large daisy chain arrays with links between the top and bottom chips formed by the room temperature thermocompression bonded contacts. The DC electrical resistance of the room temperature thermocompression formed daisy chain arrays are shown in FIG. 4 of U.S. patent application Ser. No. 17/356,386 filed 23 Jun. 2021 with the title "Room Temperature Thermocompression Bonding using High Pressure Contacts". These arrays were robust to handling and did not require epoxy underfilling. These arrays were subjected to thermal cycling at cryogenic temperatures by immersion into liquid helium.

The microstructures 10 and process described above enables temporary thermocompression bonding of microelectronic components (die-to-die, die-to-wafer, and wafer-to-wafer) to be performed at room temperature before final bonding as evidenced by the fact that the temporary bonds can be undone, this is, debonded allowing the previously temporarily bonded die or wafers 6, 8 to be separated from each other. The bonding method relies on knife-edge shaped device microstructures 10 that plastically deform under modest applied pressure at room temperature and initially form temporary attachments (tack bonds) between components (such as die and/or wafers 6, 8) that can be separated or fully bonded using themselves or other bond pad structures in a subsequent step. The microstructures 10 disclosed herein have arrays of rows of tapered, sharp tip metal microstructures 10 that are preferably oriented perpendicularly during tack bonding to minimize the force needed to temporarily join the components (such as die or wafers 6, 8). In current flip-chip bonding applications, thermocompression bonding of microelectronic components is a permanent process (all or nothing) and misaligned parts are not repairable. The tack bonding process disclosed herein with respect to FIGS. 1a-1h does not require high applied pressures and high temperatures (>200° C.) to join metal surfaces, but rather uses low forces and room temperature conditions, allowing inspection and handling of the tack-bonded dies or wafers 6, 8 to be performed before the permanent bonds are engaged by applying higher pressures and/or temperatures. Since the electrical contact pads are not necessarily engaged, repair of the temporarily tacked components can be separated, if need be, without damage to the functional parts of electronic components or devices integrated into dies or wafers 6, 8.

A unique application of the knife-edge microstructures 10 described above is now described which that takes advantage of the ability of the knife-edge structures 10 to temporarily attach two dies or wafers 6, 8, using the room temperature bonding process described above, and standoff the bonding of neighboring conventional flat electrical bonding pads 20 until higher forces (and perhaps higher temperatures as well) are applied. This allows a low force precision bonder to the initially attachment the dies or wafers 6, 8 and the opportunity for inspection of same prior to permanent bonding either using the knife-edge structures (previously described herein) or using neighboring flat pads 20 that are not initially engaged as they then stand off from each other. The standoff feature of the knife-edge bonding is due to the difference in heights (see reference numeral 22 of FIG. 2e) of the knife-edge structures 10, typically fabricated in the range of 0.1 to 10 μm (heights are governed by the taper angle (metal dependent, ex. gold is 78 degrees, and Ti is 65 degrees) and the base dimensions), and flat contact pad dimensions (thermocompression bond pads 20 typically range in thickness or height h' ranges from 0.2 μm to 1 μm). This height difference 22, or h–h', allows engagement of the knife-edge structures 10 (preferably at least ~2× the height h' of the pads 20) without physical contact of the shorter electrical contacts (the pads 20) when the low bonding force is applied to initially engage microstructures 10. FIGS. 2a-2e show a schematic illustration of a fabrication process flow for making the knife-edge structures 10 and the flat contact pad 20 arrays. As an example, for Au knife-edge structures with a 78 degree taper angle, a standoff height 22 of ~3 μm can be generated using pairs of knife-edge structures with a 0.625 μm width base. Practically speaking, the heights h of the individual knife-edges range from ~0.1 μm to 10 μm. Thermocompression bond pad 20 metal stack-ups typically include a thin adhesion layer (Ti, Cr, for example), a thin diffusion barrier (Pt, Pd, for example), and a thicker (0.1-1 μm) Au bond metal layer.

The height h of the knife-edge microstructures is governed by dimensions of the base portion thereof. As such, a variation in the heights h of a plurality of knife-edge microstructures formed at the same time are then governed by a variation of the dimensions of the base portions thereof. If openings in a mask used to form the plurality of knife-edge microstructures have a uniform size, then the heights h of the plurality of knife-edge microstructures deposited through such openings will be similarly uniform.

As is mentioned above, FIGS. 2a-2e illustrate a process flow for fabricating an array of high-density fine pitch bond array pads 20 on semiconductor dies or wafers 6, 8 (see FIGS. 2a and 2b) together with a low-density of temporary knife-edge bonding structures 10 (see also FIG. 2d). The temporary knife-edge bonding structures 10 are disposed (see FIG. 2d) preferably positioned at the periphery of the fine-pitch array of pads 20, preferably in locations that allows uniform support of a temporarily bonded opposing die or wafer 6, 8 (see FIG. 3b). This fabrication process consists of fabricating the fine-pitch array bond pads 20 as is depicted by FIG. 2b. This may be accomplished using an image reverse photolithography process that defines the array and pad patterns, that is followed by a metal evaporation process (see "Contact Metal" adjacent the downward facing arrow of FIG. 2b). The array of fine-pitch bond pads 20 may be used for traditional thermocompression bonding. Typically, each pad 20 consists of a metal stack consisting of an adhesion layer, a diffusion barrier layer, and a bond layer. Typical, fine-pitch bond pads 20 consist of a metal stack consisting of 50 Å Ti/500 Å Pt/5000 Å Au for Au—Au thermocompression bonding with lateral dimensions of <6 μm on a 10 μm pitch. The temporary knife-edge bond structures 10 are fabricated preferably using an image reverse photolithography process (see "IR Layer Resist" adjacent the downward facing arrow of FIG. 2c) using thicker photoresist layer 12 than that used in the step for forming the pads shown in FIG. 2b to allow the taller temporary knife-edge structures 10 to be formed by metal deposition/evaporation (see "Taper Metal" adjacent the downward facing arrow of FIG. 2d). The temporary knife-edge bond structures 10 are taller than the height of pads 20 as denoted by a distance 22 on FIG. 2e. The temporary knife-edge structures 10 are preferably fabricated along the periphery of the fine-pitch array 20 in low densities such that they can be de-bonded with a low force (normal to the bonded chip surface) if needed, for example, to correct alignment errors or to replace an improperly functioning chip, chiplet, die or wafer 6, 8. The evaporation process through openings 14 in photoresist layer 12 results in tapered metal knife-edge structures with a taper angle ranging from 65 to 80 degrees depending on the metal used and with a height h that is taller than the fine-pitch bond pads 20 (see distance 22). The knife edges form as the deposited/evaporated metal pinches off over openings 14 as the deposition process proceeds. The knife-edge shaped microstructures 10 allow strong tack bonds to form without added heating at room temperatures due to the small contact areas during bonding of knife-edge structures of opposing dies or wafers 6, 8. Even though the tack bonds are strong, the dies or wafers 6, 8 can be separated from each other without damaging their circuitries as evidenced by FIG. 1b. In typical uses for temporary bonding, the knife-edge microstructures 10 number in density in the range of 1-100/mm² allowing these strong but low density, small area bonds to tack the chips in place temporarily before permanently bonding the pair using the high density ($10^4$->$10^6$/mm²) fine-pitch bond pads 20. The temporary nature of the knife-edge tack bonding is due to the small contact areas and preferably low densities (numbers) of knife-edge microstructures 10 used on dies or wafers 6,8.

Therefore, FIGS. 2a-2e depict a schematic illustration of an embodiment of the knife-edge microstructures 10 and flip chip contact pads 20 which allow for the initial temporary attachment process and the following permanent bonding process of this invention. The number, size and distribution of knife-edge structures 10 is designed to temporarily hold the bonded dies or wafers 6, 8 together and parallel to each other (see FIG. 3b) then temporarily bonded using the knife-edge microstructures 10. This enables alignment inspection (for example, by infra-red microscopy) prior to engaging the flat pads 20 via a conventional flip chip thermocompression permanent bonding process (see FIG. 3c). The density of the knife-edge structures 10 is kept low to allow detachment of the temporarily attached components (if warranted) by applying low pulling forces (ex. vacuum-based puller (e.g., <14 lb/in²)). With typical fine-pitch bonding embodiments, flat pad densities range from $10^6$ to $10^4$ pads/mm² and knife-edge structures 10 in the range in densities of 1-100 structures/mm². The low densities of knife-edge structures ~10 per unit area and their small contact areas (100 nm²) require low forces (10-100 mg-force/mm²) to bond the microstructures 10 on opposing components 6, 8. On the other hand, the thermocompression bonding of the flat pads 20 with extremely high densities ($10^6$ to $10^4$ pads/mm²) and larger pad areas of 1-100 μm² require substantially higher pressures (4 kg-force/mm² of bond area). The >$10^5$ difference in applied force between that needed to engage the knife-edge structures 10 and that needed to bond the high density fine-pitch flat pads 20, allows the knife-edge structures 10 to be selectively attached at low forces without engaging the flat pads 20 and then for permanent bonding to be completely plastically deformed under the conditions required to bond the flat pad 20 arrays.

Figure 3A:
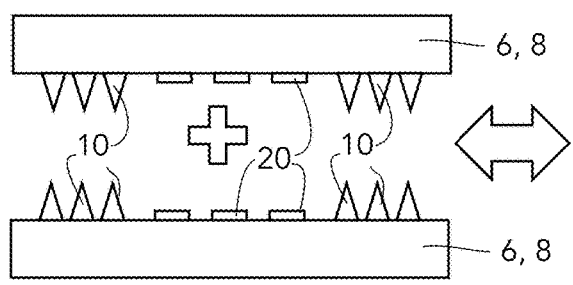
FIGS. 3a-3c depict an embodiment of the temporary attachment process (FIG. 3a to FIG. 3b) using knife-edge structures and the permanent attachment process (FIG. 3b to FIG. 3c) using the knife-edge structures together with an array of flat pads.
Figure 3B:
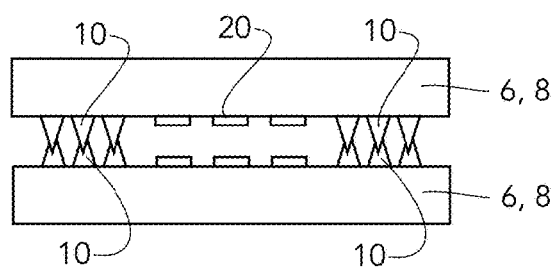
Figure 3C:
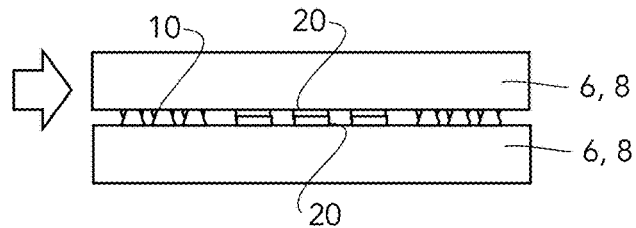

FIGS. 3a-3c depict an embodiment of the temporary attachment process (see FIG. 3a to FIG. 3b) using knife-edge structures 10 and an embodiment of the permanent attachment process (see FIG. 3b to FIG. 3c) using the knife-edge microstructures 10 together with an array of flat pads 20. The knife-edges $10_{KE}$ of microstructures 10 provide temporary bonding (small area contacts allow formation of bonds through plastic deformation at low applied forces . . . called "tack bonds" herein) and standoff capability (due to their larger heights relative to flat pad electrical contacts 20). The temporary attached components 6, 8 can be debonded at low forces because the knife-edge microstructures 10 are needed only in small numbers and the initial bonding only forms weak physical bonds. These figures show that the flat pad bonding (see FIG. 3b to FIG. 3c) occurs at high applied forces (resulting in higher per contact pressures), significantly higher than the force applied during the tack bonding of the knife-edge microstructures 10. The large differences (>$10^5$ times) between the force needed to engage the knife-edges (see FIG. 3a to FIG. 3b) and the higher force needed to thermocompression bond the flat pads 20 (see FIG. 3b to FIG. 3c), cause the knife-edge structures to be compressed further by plastic deformation during the bonding of the flat pads (shown in FIG. 3c). The bonding of the knife-edge structures 10 (see FIG. 3a to FIG. 3b) can be performed in a low-force bonder with precision alignment capability while the bonding of the flat pad contacts 20 (see FIG. 3b to FIG. 3c) can be performed in a high force press without alignment capability.

This technology described above provides for the possibility of a number of advantages compared to more traditional bonding and inspection techniques:

First, the disclosed process has the ability make the microstructures 10 very small in size and closely spaced to one another (in the sub-micron pitch range) since the size and this spacing (pitch) limit are dictated by the lithography process being used. With the advance of technology, lithography processes have allowed finer and finer structures to be formed. The microstructures 10 can be formed without the need for seed layers, can be formed in a single deposition (even with multiple metals . . . see, for example the embodiment of FIG. 1h) making them inherently self-aligned and without the need for a release layer. Thus, the size and pitch of the microstructures 10 can be made as small as the smallest structures that can be formed by a modern lithography process. And the uniformity of the heights h of the microstructures 10 will depend on how uniform the openings in a mask through which the microstructures 10 are formed can be made using a modern lithography process.

Second, the microstructures 10 can have a very sharp edge $10_{KE}$, so the compression force applied per tip or knife-edge $10_{KE}$ when temporarily bonding chips, chiplets, dies or wafers 6, 8 together can be moderate (high yields have been demonstrated over the range of 6.8 to 47 mg-force per microstructure), the force at the knife edges $10_{KE}$ of the microstructures 10 is magnified by their sharpness. The processing described herein allows the sharpness to be maintained since once knife-edges $10_{KE}$ are formed, they need not be subjected to additional processing which could dull their original sharpness. And given the magnification of the force at the knife-edges $10_{KE}$, that means that less force is needed per microstructure 10 and hence more microstructures 10 may be utilized on a given chip, chiplet, die or wafer 6, 8 compared to more traditional methods. This is important since the bonding equipment (i.e., precision bonders or precision probe stations) typically are limited in the force that they can apply (for example, a FC300 precision bonder by SET Corporation SA has a 3000 kg limit). Moreover, the disclosed process is a single step process (evaporation, see FIG. 2d) that produces the tips (knife-edges) $10_{KE}$ the microstructures 10 directly and the self-terminating nature of the tip (knife-edge) $10_{KE}$ formation process forms the tips (knife-edges) of the microstructures 10 with great sharpness.

Third, the microstructures 10 exhibit very uniform heights h. The variation in height h has been determined to be <100 nm for a plurality of microstructures 10 formed during a single deposition process (which may involve multiple metals as shown in FIGS. 1g and 1h). The height h of the microstructures 10 is affected by the particular lithography process used to define the microstructure 10 as the knife-edge tip thereof self-terminates during formation and thus, their height h does not depend on the deposition rate or the spatial variation thereof or the thickness uniformity of the masking layer thereof. Having a minimum amount of height h variation is an important parameter in array probing that affects the required force for bonding (for example, the force required to bend the probe substrate or the amount of displacement needed into the probed site to accommodate the tip height difference and ultimately the wafer's array pitch). Mechanically, if there are differences in the heights h between neighboring microstructures 10, the only way to accommodate that is to either bend the substrate 6 or 8 (analogous to a bending beam or plate) or to make up the height h difference by over penetrating the taller tips (knife-edges) $10_{KE}$ of the microstructures 10 having the greatest heights h into the mating microstructures, layers or bumps. The disclosed process of microstructure 10 formation yields a significantly smaller tip height h variation (<100 nm) than that attainable by the prior art and has been demonstrated to a microstructure 10 pitch distance down to 2.5 µm using i-line stepper-based photolithography for ~3.5 µm tall microstructures with no measurable difference in applied tip pressures across an array of microstructures 10.

Fourth, the microstructure 10 are preferably formed by an evaporation/deposition process rather an electroplating process (for example) which means that the microstructure 10 may be formed of metals that do not lend themselves to be electroplated, such as Ti. Also, an electroplating process may well yield a microstructure 10 with less sharp tips (knife-edges) $10_{KE}$ than the desired evaporation/deposition process provides.

Fifth, the optional ability to engineer the mechanical properties of the probe tip or knife-edge $10_{KE}$ by layering and over-coating the probe tip with multiple-layers of different metals (see FIGS. 1g and 1h) provides advantage not available in the prior art The ability to fabricate composite metal probe tips allows customization of mechanical properties (i.e., effective Young's modulus, tip hardness, electrical conductivity of the outer layer, shear properties, etc.) that do not depend on a single metal component. The plating process is limited in providing this ability, however, in our spike evaporation method we have the ability layer numerous (>10) individual metals or alloys and can have hard or soft interiors and exteriors.

Sixth, the disclosed process uses a single lithography step and one deposition process, even with multiple metal such as in the embodiment if FIG. 1h. This makes the disclosed process significantly more manufacturable and lower cost to perform than prior art techniques and yields microstructures 10 for which the single metal embodiments thereof are inherently self-aligned and for which the multiple metal embodiments thereof may be self-aligned.

Seventh, opposing knife-edge $10_{KE}$ the microstructures 10 on the chips, chiplets, dies or wafers 6, 8 in the precision bonding equipment form weak metallurgical bonds with only a moderate compressive pressive applied between them at room temperature. This allows the temporarily bonded chips, chiplets, dies or wafers 6, 8 to be inspected (while spaced apart by the standoff distance 22) before applying elevated temperature and pressure in a less precision bonder to allow engagement and permanent bonding of the flat pads 20 via a conventional flip chip thermocompression permanent bonding process, as depicted by FIG. 3c, thereby bringing the standoff distance 22 to zero.

The technology disclosed has manufacturing utility for a number of reasons:
- Ordinarily, thermocompression bonding is permanent and is not re-workable. The temporary standoff bonding of the knife-edge structures allows room temperature (no heat required) assembly and inspection prior to permanent bonding. Rework of expensive components provides cost savings in scrapping poorly aligned components.
- The temporary bonding can be performed in a precision bonder without the high force or heating capability thus enabling less expensive, less capable tools for manufacturing.
- Batch, thermocompression bonding can be performed in a press without alignment capability after the parts are temporarily assembled.

Of course, the bonding of the microstructures 10 on opposing die or wafers 6, 8 need not necessarily stop with a temporary bond in order to allow inspection of the device under manufacture but may proceed directly to the formation of permanent bonds by applying higher pressures and/or temperatures.

The tack bonds using microstructures 10 described herein may be accomplished at room temperatures. It should be understood that the bonding temperature may be increased above room temperature if it is desirable, for example, to reduce even further the amount of pressure applied during such bonding.

The fact that the bonding described herein can be accomplished at room temperature has important benefits owing to the facts that: (1) temperature sensitive components (ex. infra-red detectors) can be bonded (hybridized) at room temperature using high performance (low resistivity, high strength) bond metals (Au, Cu, Al, W); (2) the process allows the metallurgical bonding of high melting point metals without heat at room temperature (including metals whose melting points are over 1000° C. (ex. Au (1063° C.), Cu (1084° C.)), (3) bonding process times are reduced compared to high temperature bonding methods by eliminating the ramp-up and ramp-down temperature sequences, (4) the knife-edge bond process allows rapid assembly of components in seconds by providing intimate surface contact through plastic deformation at high pressures and (5) with demonstrated fine-pitch capability (demonstrated <3 µm).

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. An electronic component, die or wafer, comprising:
   a first array of microstructures on a major surface of the electronic component, die or wafer that project in a direction essentially normal to the major surface, the microstructures each terminating at a distal end thereof with an elongate edge spaced at a height h from the major surface; and
   a second array of structures on the major surface having flat, planar surfaces spaced at a height h' from the major surface, the height h' being no more than one half the height h;
   wherein the first array of microstructures are formed adjacent to and spaced apart from the second array of microstructures on the major surface of the electronic component;
   wherein the first array of microstructures are configured to have a plurality of layers parallel to the major surface with alternating hardnesses,
   wherein the first array of microstructures are configured to temporarily bond with a corresponding array of microstructures formed on a second electronic component, die or wafer, before the second array of structures permanently bonding with a corresponding array of structures of the second electronic component, die or wafer.

2. The electronic component, die or wafer of claim 1, wherein the first and second arrays of microstructures are each formed of a metallic material.

3. The electronic component, die or wafer of claim 2, wherein the elongate edge of each microstructure of the first array has a surface area that is less than a surface area of each microstructure of the second array.

4. The electronic component, die or wafer of claim 3, wherein the surface area of at least one microstructure of the first array is at least ten times less than the surface area of at least one microstructure of the second array.

5. The electronic component, die or wafer of claim 1, wherein the first array of microstructures comprise knife-edge metal microstructures disposed on the major surface of the electronic component, die or wafer with sharp tips that provide bonding interface surfaces that are substantially free of surface asperities and roughness, the knife-edge metal microstructures having base portions affixed to the major surface of the electronic component, die or wafer, the knife-edge metal microstructures having a hardness allowing them to plastically deform at room temperature when the knife-edge metal microstructures are pressed against other knife-edge structures or planar metal surfaces of the second electronic component, die or wafer, the deformation of the knife-edge metal microstructures being due to high stresses generated due to physical dimensions of the knife-edge metal microstructures, the sharp tips developing a local tip pressure at the bonding interface surfaces that are $>10^4$ times higher than that at the base portions of the knife-edge metal microstructures when deforming.

6. The electronic component, die or wafer of claim 5, wherein the knife-edge metal microstructures are formed from a metal allowing metallurgical bonds to be formed between the knife-edge metal microstructures and said planar metal surfaces, wherein the deformation of the knife-edge metal microstructures provides intimate surface contact overcoming surface roughness and asperities, and breaking surface oxides.

7. The electronic component, die or wafer of claim 5, wherein the knife-edge metal microstructures are formed from a metal forming metallurgical bonds between knife-edge structures and with knife-edge surfaces and planar metal surfaces having characteristic metal-metal bond strengths, with bond areas being sufficiently small providing weak attachment to another electronic component, die or wafer without functional damage to either one.

8. The electronic component, die or wafer of claim 5, wherein the knife-edge metal microstructures have a height governed by dimensions of the base portion thereof.

9. The electronic component, die or wafer of claim 8, wherein the knife-edge metal microstructures have a variation in height governed by a variation of the dimensions of the base portion thereof.

10. Apparatus for making a thermocompression bond between mating structures on first and second electronic components, dies or wafers, the apparatus comprising:
   initial mating structures on the first electronic component, die or wafer comprising an array of microstructures on a major surface of the first electronic component, die or wafer that project in a direction essentially normal to the major surface of the first electronic component, die or wafer, the microstructures each terminating at an elongate edge or surface distal from the major surface of the first electronic component, die or wafer;
   additional mating structures on the major surface of the first electronic component, die or wafer comprising an array of planar pads having a height extending way from the major surface of the first electronic component, die or wafer which is less than a height of the array of microstructures projecting in said direction essentially normal to the major surface of the first electronic component, die or wafer of the above a major surface of the first electronic component, die or wafer, wherein the initial mating structures on the first electronic component, die or wafer are formed adjacent to and spaced apart from the additional mating structures on the major surface of the first electronic component, die or wafer;
   initial mating structures on a major surface of the second electronic component, die or wafer comprising an array of structures arranged to mate with the array of microstructures that project in a direction essentially normal to the major surface of the first electronic component, die or wafer;
   additional mating structures on the major surface of the second electronic component, die or wafer comprising an array of structures arranged to mate with the additional mating structures on the major surface of the first electronic component, die or wafer, wherein the initial mating structures on a major surface of the second electronic component, die or wafer are formed adjacent to and spaced apart from the additional mating structures on the major surface of the second electronic component, die or wafer;
   means for applying an initial compressive pressure between the first and second electronic components, dies or wafers to cause the initial mating structures on the first and second electronic components, dies or wafers to weld temporarily; and
   means for applying a subsequent compressive pressure between the first and second electronic components, dies or wafers to cause the additional mating structures on the first and second electronic components, dies or wafers to weld after inspecting the first and second electronic components, dies or wafers whose initial mating structures are temporarily welded together;
   wherein the mating structures on the first and second electronic components, dies or wafers are being configured to have a plurality of layers parallel to the major surfaces of the first and second electronic components, dies or wafers with alternating hardnesses.

11. The apparatus of claim 10, wherein the elongate edges or surfaces of the first electronic component, die or wafer are disposed at essentially a right angle to the elongate edges or surfaces of the second electronic component, die or wafer when temporarily welded together.

* * * * *